United States Patent
Kushida

(10) Patent No.: US 9,413,293 B2
(45) Date of Patent: Aug. 9, 2016

(54) CRYSTAL DEVICE

(71) Applicant: MURATA MANUFACTURING CO., LTD.

(72) Inventor: Michiyasu Kushida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/871,824

(22) Filed: Sep. 30, 2015

(65) Prior Publication Data

US 2016/0028348 A1 Jan. 28, 2016

Related U.S. Application Data

(63) Continuation of application No. PCT/JP2014/057538, filed on Mar. 19, 2014.

(30) Foreign Application Priority Data

Apr. 22, 2013 (JP) ................ 2013-089471

(51) Int. Cl.

| H03H 9/19 | (2006.01) |
|---|---|
| H03B 5/32 | (2006.01) |
| H01L 23/10 | (2006.01) |
| H01L 21/50 | (2006.01) |
| H03H 9/10 | (2006.01) |
| H03H 9/05 | (2006.01) |

(52) U.S. Cl.
CPC *H03B 5/32* (2013.01); *H01L 21/50* (2013.01); *H01L 23/10* (2013.01); *H03H 9/1021* (2013.01); *H03H 9/19* (2013.01); *H01L 2924/0002* (2013.01); *H03H 9/0509* (2013.01)

(58) Field of Classification Search
CPC .......... H03B 5/32; H03B 9/1021; H03B 9/19
USPC .................................................. 331/68, 158
See application file for complete search history.

(56) References Cited

U.S. PATENT DOCUMENTS

| 3,602,634 A * | 8/1971 | Meuli ............... H01L 21/50 174/50.61 |
|---|---|---|
| 6,396,201 B1 | 5/2002 | Ide et al. |
| 2012/0249255 A1 * | 10/2012 | Ariji ............. H03H 9/02086 331/158 |
| 2014/0028155 A1 | 1/2014 | Oishibashi et al. |

FOREIGN PATENT DOCUMENTS

| JP | 11-069491 A | 3/1999 |
|---|---|---|
| JP | 2008-236514 A | 10/2008 |
| WO | WO 2012/140936 A1 | 10/2012 |
| WO | WO 2013/027017 A1 | 2/2013 |

* cited by examiner

*Primary Examiner* — Joseph Chang
(74) *Attorney, Agent, or Firm* — Arent Fox LLP

(57) ABSTRACT

A crystal device having electrode lands on a principal surface of a first package member, a crystal oscillator bonded to and held by the electrode lands, a second package member bonded to the principal surface of the first package member by an adhesive layer, a glass layer provided on the principal surface of the first package member, and the glass layer having adhesive spread preventing parts and an extended portion. The adhesive spread preventing parts prevent the adhesive of the adhesive layer from spreading out. The extended portion is extended to reach the lower surfaces of the electrode lands.

11 Claims, 2 Drawing Sheets

CRYSTAL DEVICE

CROSS REFERENCE TO RELATED APPLICATIONS

The present application is a continuation of International application No. PCT/JP2014/057538, filed Mar. 19, 2014, which claims priority to Japanese Patent Application No. 2013-089471, filed Apr. 22, 2013, the entire contents of each of which are incorporated herein by reference.

FIELD OF THE INVENTION

The present invention relates to a crystal device having a crystal oscillator contained in a package. More specifically, the present invention relates to a crystal device in which first and second package members are stuck to each other by means of a frame-shaped adhesive layer.

BACKGROUND OF THE INVENTION

In related art, crystal devices are widely used for resonators or the like. Patent Document 1 discloses an example of such a crystal device.

In Patent Document 1, an electrode land is provided on the principal surface of the first package member. A crystal oscillator is bonded to this electrode land and supported in a cantilever fashion. In a frame-shaped adhesion area provided on the principal surface of the first package member, a second package member is bonded to the first package member by means of a frame-shaped adhesive layer. The internal space of the crystal device is sealed as a result.

The crystal device disclosed in Patent Document 1 has a frame-shaped glass layer provided on the principal surface of the first package member to prevent adhesive from spreading out. More specifically, the plate-like glass layer is provided on the principal surface of the first package member, between the peripheral edge of the frame-shaped adhesion area and the peripheral edge of the principal surface of the first package member.

Patent Document 1: WO2012/140936

SUMMARY OF THE INVENTION

A crystal substrate of a crystal oscillator is subjected to finishing such as barrel finishing or beveling in many cases. Such a crystal substrate is relatively thin in its peripheral portion in comparison to its central portion. In Patent Document 1, the portion of the crystal oscillator near its end portion is bonded to and held by the electrode land with adhesive. Accordingly, use of a crystal oscillator subjected to barrel finishing or beveling as mentioned above may cause the thick portion of the crystal oscillator to come into contact with the principal surface of the first package member. Such contact of the crystal oscillator with the principal surface of the first package member significantly impairs the vibration characteristics of the crystal oscillator.

One conceivable way to prevent the above contact would be to increase the height of the portion of the crystal oscillator bonded to the electrode land. However, increasing the height of the bonded portion makes it impossible to achieve low profile construction. In addition, the mechanical strength of the connecting portion is also impaired.

It is an object of the present invention to provide a crystal device that is unlikely impair vibration of a crystal oscillator.

A crystal device according to the present invention includes a first package member, an electrode land, a crystal oscillator, a second package member, an adhesive layer, and a frame-shaped glass layer. The first package member has a principal surface. The electrode land is provided on the principal surface of the first package member. The crystal oscillator is mounted over the principal surface of the first package member, and is bonded to and held by the electrode land.

The second package member is stuck to the principal surface of the first package member to define a hollow part together with the principal surface of the first package member. The adhesive layer sticks the first package member and the second package member to each other in a frame-shaped adhesion area provided on the principal surface of the first package member. The frame-shaped glass layer is provided on the principal surface of the first package member.

According to the present invention, the crystal oscillator has a portion that is thicker than a portion held by the electrode land. Further, the frame-shaped glass layer has an adhesive spread preventing part and an extended portion. The adhesive spread preventing part is provided in an area between at least a part of a peripheral edge of the frame-shaped adhesion area and a peripheral edge of the principal surface of the first package member. The extended portion is extended to reach a lower surface of the electrode land.

According to a specific aspect of the crystal device according to the present invention, the crystal oscillator is subjected to barrel finishing or beveling so that at least a part of a peripheral edge of the crystal oscillator is made thinner than a central portion.

According to another specific aspect of the crystal device according to the present invention, the crystal oscillator is supported in a cantilever fashion by the electrode land.

According to still another specific aspect of the crystal device according to the present invention, in the adhesive spread preventing part, the frame-shaped glass layer is in contact with the peripheral edge of the frame-shaped adhesion area.

According to yet still another specific aspect of the crystal device according to the present invention, the frame-shaped glass layer has a thickness that is greater than a thickness of the adhesive layer.

In the crystal device according to the present invention, the glass layer has an extended portion that is extended to reach the lower surface of the electrode land. Accordingly, the portion of the crystal oscillator bonded to the electrode land is increased in height. Therefore, it is possible to reliably prevent the crystal oscillator from coming into contact with the principal surface of the first package member. This reduces the risk of impairing the vibration characteristics of the crystal oscillator.

DETAILED DESCRIPTION OF THE PREFERRED EMBODIMENTS

Figure 1:
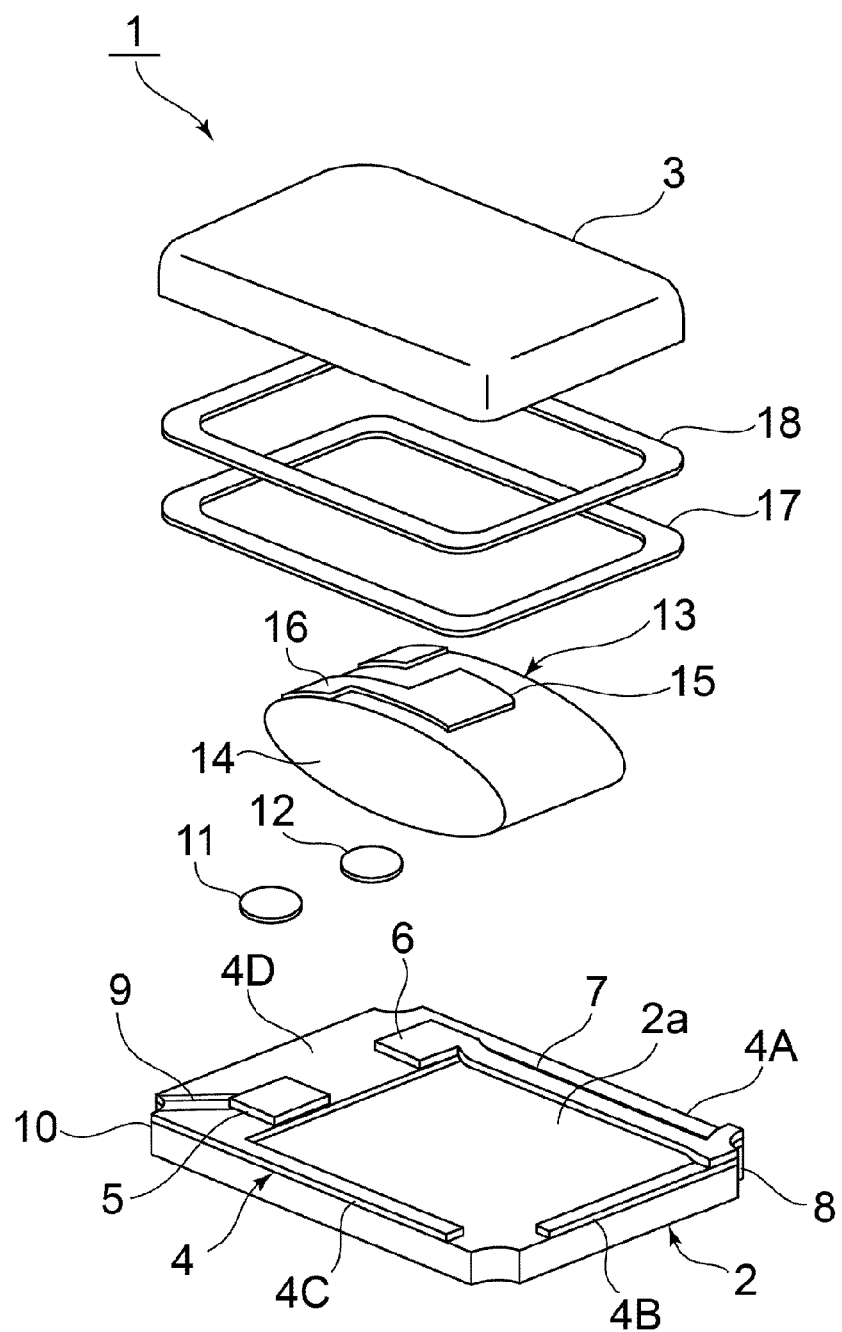
FIG. 1 is an exploded perspective view of a crystal device according to an embodiment of the present invention.

Hereinafter, the present invention will be described in more detail by way of its specific embodiment with reference to the drawing.

Figure 2:
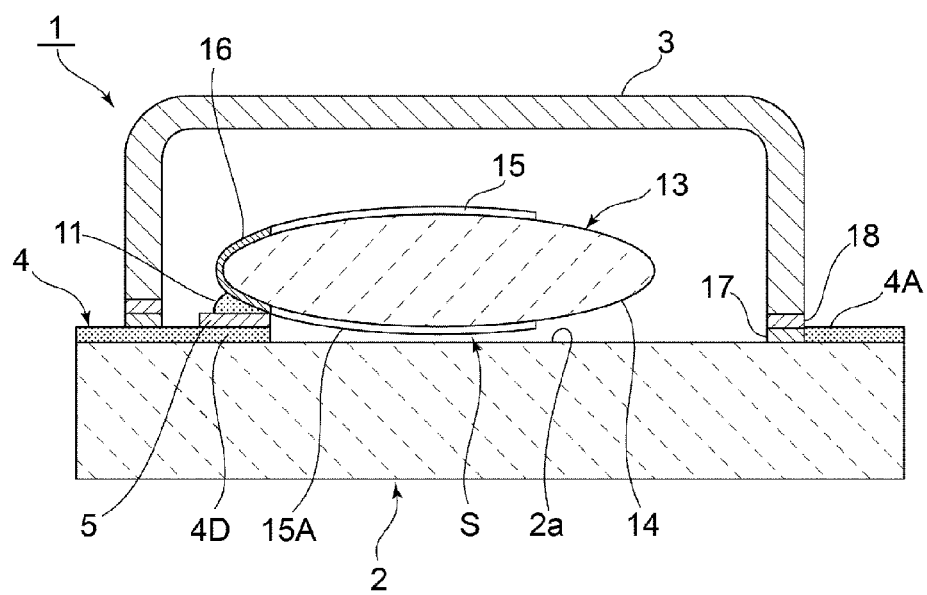
FIG. 2 is a front sectional view of a crystal device according to an embodiment of the present invention.

FIGS. 1 and 2 are an exploded perspective view and a front sectional view, respectively, of a crystal device according to an embodiment of the present invention.

A crystal device 1 has a first package member 2, and a second package member 3. The first package member 2 and the second package member 3 form a package having a hollow part.

In this embodiment, the first package member 2 is formed by a substantially rectangular plate-like substrate. This substrate is made of an insulating ceramic such as alumina. However, insulating materials other than a ceramic may be used.

Figure 3:
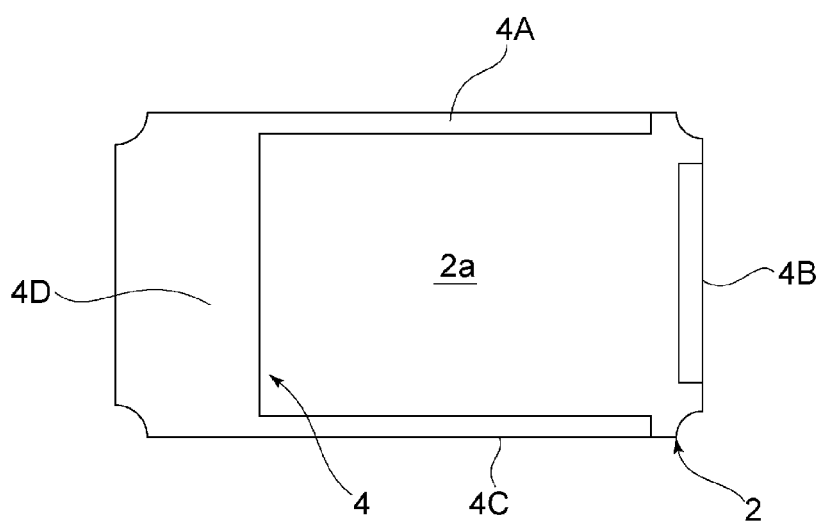
FIG. 3 is a plan view illustrating a state in which a glass layer is provided on a first package member in a crystal device according to an embodiment of the present invention.

In this embodiment, a glass layer 4 having a frame-like shape is provided on the upper surface of the first package member 2. FIG. 3 is a plan view illustrating a state in which the glass layer 4 having a frame-like shape is provided on the upper surface of the first package member 2.

Further, as illustrated in FIG. 1, first and second electrode lands 5 and 6 are provided on a principal surface 2a of the first package member 2. The first and second electrode lands 5 and 6 are located near one longitudinal end of the first package member 2. The second electrode land 6 is connected with an extended electrode 7. The extended electrode 7 is extended to reach a longitudinal end portion of the first package member 2 opposite to the end portion where the first and second electrode lands 5 and 6 are provided. The extended electrode 7 is electrically connected to an outer electrode 8 provided at a corner. The first electrode land 5 is also connected with an extended electrode 9. The extended electrode 9 is electrically connected to an outer electrode 10. The outer electrode 10 is provided at the corner located diagonally from the outer electrode 8.

Although the glass layer 4 has a frame-like shape, the glass layer 4 having a frame-like shape is cut at the corner where the outer electrode 8 is provided, and at the corner located opposite to this corner along the short side.

The glass layer 4 with a frame-like shape has adhesive spread preventing parts 4A to 4C that prevent spreading out of adhesive described later. The adhesive spread preventing parts 4A to 4C are provided along the peripheral edge of the first package member 2. Further, an extended portion 4D is provided so as to connect with the adhesive spread preventing parts 4A and 4C. The extended portion 4D is extended to reach the lower surfaces of the first and second electrode lands 5 and 6 illustrated in FIG. 1.

In the area where the extended electrode 7 is provided, the adhesive spread preventing part 4A is provided between the edge of the outer side portion of the extended electrode 7, and the peripheral edge of the first package member 2.

Therefore, although the second electrode land 6 is provided on the extended portion 4D, the extended electrode 7 is provided directly on the principal surface 2a of the first package member 2.

The surface roughness of the glass layer 4 is preferably less than the surface roughness of the first package member 2. This makes it possible to more reliably prevent adhesive from spreading out.

The glass layer 4 may be made of a suitable glass. For example, a glass containing a silicon oxide or zinc oxide may be used. Alternatively, the glass layer 4 may be made of semi-crystalline glass.

The first and second electrode lands 5 and 6, the extended electrodes 7 and 9, and the outer electrodes 8 and 10 may be formed using a suitable metal such as Cu or Al or an alloy thereof.

A crystal oscillator 13 is bonded to the first package member 2 by means of first and second conductive adhesive layers 11 and 12. More specifically, the crystal oscillator 13 is bonded to the first and second electrode lands 5 and 6 by means of the first and second conductive adhesive layers 11 and 12, respectively. As a result, the crystal oscillator 13 is supported in a cantilever fashion.

The crystal oscillator 13 has a crystal substrate 14. The crystal substrate 14 is subjected to beveling in this embodiment. Accordingly, the crystal substrate 14 is made thinner at its both longitudinal ends than in its central portion. It suffices that at least a part of the peripheral edge of the crystal substrate 14 be made thinner than the central portion.

A first vibrating electrode 15 is provided on the upper surface of the crystal substrate 14. As illustrated in FIG. 2, a second vibrating electrode 15A is provided on the lower surface of the crystal substrate 14 so as to be located opposite to the first vibrating electrode 15 with the crystal substrate 14 interposed therebetween.

The first vibrating electrode 15 is connected with an extended electrode 16. The extended electrode 16 is extended from the upper surface of the crystal substrate 14 to reach the lower surface via the side surface. The portion of the extended electrode 16 extended to the lower surface is bonded to the first electrode land 5 by means of the first conductive adhesive layer 11.

The extended electrode connected with the second vibrating electrode 15A on the lower surface is bonded to the second electrode land 6 by means of the second conductive adhesive layer 12. Accordingly, the crystal oscillator 13 is supported in a cantilever fashion on one longitudinal end side.

In a frame-shaped adhesion area on the principal surface 2a of the first package member 2, the second package member 3 is bonded to the principal surface 2a of the first package member 2, with an adhesive layer 17 having a frame-like shape and an insulating layer 18 having a frame-like shape interposed therebetween. Although not particularly limited, the adhesive layer 17 having a frame-like shape is made of resin adhesive. This resin adhesive is not particularly limited. As this resin adhesive, a resin adhesive using thermosetting resin, or a resin adhesive using photo-curing resin may be used. More specifically, for example, an epoxy-based, silicone-based, urethane-based, or imide-based resin adhesive may be used.

The insulating layer 18 having a frame-like shape is provided to increase the reliability of electrical insulation between the first package member 2 and the second package member 3. That is, in this embodiment, the second package member 3 is made of metal and has electrical conductivity. Accordingly, it is desirable to provide the insulating layer 18 having a frame-like shape. The insulating layer 18 as mentioned above may be made of, for example, an epoxy-based, silicon-based, urethane-based or imide-based insulating resin or insulating metal oxide. However, the insulating layer 18 having a frame-like shape may not necessarily be provided.

The second package member 3 is shaped like a cap that is open at the bottom. The second package member 3 is made of metal in this embodiment. However, the second package member 3 may be made of a material other than metal, for example, synthetic resin.

Features of the crystal device 1 according to this embodiment will be described with reference to FIG. 2.

In the crystal device 1, the crystal oscillator 13 is supported in a cantilever fashion over the principal surface 2a of the first package member 2. In this regard, the crystal substrate 14 of the crystal oscillator 13 is made thicker in its central portion than in the portion bonded to and held by the electrode land 5.

Accordingly, the thick portion of the crystal oscillator 13 is in close proximity to the principal surface 2a of the first package member 2.

The problem with the crystal device according to related art as described in Patent Document 1 is that this thick portion comes into contact with the upper surface of the first package member, impairing vibration characteristics. In this regard, in the crystal device 1 according to this embodiment, the extended portion 4D of the glass layer 4 is extended to reach the lower part of the electrode land 5. Accordingly, the portion of the crystal oscillator 13 held by the electrode land 5 is increased in height by the amount of the thickness of the glass layer 4. This ensures that a sufficient gap S is provided between the crystal oscillator 13, and the principal surface 2a of the first package member 2 as illustrated in FIG. 2. Therefore, when the crystal oscillator 13 vibrates in actual use, this is unlikely to cause deterioration of its vibration characteristics due to the above-mentioned contact.

In addition, as illustrated in FIG. 2, in this embodiment, the adhesive spread preventing part 4A of the glass layer 4 is provided so as to reach the peripheral edge of the adhesive layer 17 and the peripheral edge of the principal surface 2a of the first package member 2. This makes it possible to reliably prevent adhesive from spreading out outside at the time of application of the adhesive layer 17.

While the above description is directed to the adhesive spread preventing part 4A, the other adhesive spread preventing parts 4B and 4C have a similar function.

The thickness of the glass layer 4 is preferably equal to or greater than the thickness of the adhesive layer 17, and more preferably, greater than the thickness of the adhesive layer 17. This makes it possible to more reliably prevent the adhesive forming the adhesive layer 17 from spreading out outside. Further preferably, the glass layer 4 is formed at a thickness equal to or greater than the sum of the thicknesses of the adhesive layer 17 and insulating layer 18. This also makes it possible to prevent the insulating material from spreading out outside.

In the above-mentioned example, as illustrated in FIG. 2, the adhesive spread preventing part 4A is provided so as to reach the peripheral edge of the adhesive layer 17 made of resin, and the peripheral edge of the principal surface 2a of the first package member 2. However, the adhesive spread preventing part 4A may not reach the peripheral edge of the principal surface 2a.

In the crystal device 1 according to the above embodiment, the crystal substrate 14 is subjected to beveling so that the crystal oscillator 13 is thinner at its both longitudinal ends. However, according to the present invention, the type of finishing applied to the crystal substrate 14 of the crystal oscillator 13 is not limited to that illustrated in the drawings. The crystal substrate 14 may be subjected to barrel finishing. That is, the present invention is applicable to a wide variety of configurations using a crystal substrate that is relatively thin in a portion held by the electrode lands 5 and 6 in comparison to other portions.

Further, although the crystal oscillator 13 is supported in a cantilever fashion in the above embodiment, the present invention is also applicable to configurations in which the crystal oscillator is supported on both ends.

REFERENCE SIGNS LIST 1 crystal device
2 first package member
2a principal surface
3 second package member
4 glass layer
4A to 4C adhesive spread preventing part
4D extended portion
5 first electrode land
6 second electrode land
7, 9 extended electrode
8, 10 outer electrode
11, 12 first/second conductive adhesive layer
13 crystal oscillator
14 crystal substrate
15 first vibrating electrode
15A second vibrating electrode
16 extended electrode
17 adhesive layer
18 insulating layer

The invention claimed is:

1. A crystal device comprising:
   a first package member that has a principal surface and a frame-shaped adhesion area on the principal surface;
   a frame-shaped glass layer provided on the principal surface of the first package member, the frame-shaped glass layer having an adhesive spread preventing part that is provided in an area between at least a part of a peripheral edge of the frame-shaped adhesion area and a peripheral edge of the principal surface of the first package member, and having an extended portion;
   an electrode land provided on the extended portion of the frame-shaped glass layer;
   a crystal oscillator mounted over the principal surface of the first package member, the crystal oscillator being bonded to and held by the electrode land;
   an adhesive layer in the frame-shaped adhesion area on the principal surface of the first package member; and
   a second package member attached to the adhesive layer to define a hollow part together with the principal surface of the first package member.

2. The crystal device according to claim 1, wherein the adhesive spread preventing part extends in a direction in which the peripheral edge of the first package member extends.

3. The crystal device according to claim 1, wherein the crystal oscillator has a portion that is thicker than a portion held by the electrode land.

4. The crystal device according to claim 1, wherein at least a part of a peripheral edge of the crystal oscillator is thinner than a central portion.

5. The crystal device according to claim 1, wherein the crystal oscillator is supported in a cantilever fashion by the electrode land.

6. The crystal device according to claim 1, wherein in the adhesive spread preventing part, the frame-shaped glass layer is in contact with the peripheral edge of the frame-shaped adhesion area.

7. The crystal device according to claim 1, wherein the frame-shaped glass layer has a thickness that is equal to or greater than a thickness of the adhesive layer.

8. The crystal device according to claim 1, wherein a surface roughness of the frame-shaped glass layer is less than a surface roughness of the principal surface of the first package member.

9. The crystal device according to claim 1, further comprising an insulating layer interposed between the second package member and the adhesive layer.

10. The crystal device according to claim 9, wherein the adhesive layer and the insulating layer are frame-shaped.

11. The crystal device according to claim 9, wherein the frame-shaped glass layer has a thickness that is equal to or greater than a combined thickness of the adhesive layer and the insulating layer.

\* \* \* \* \*